United States Patent [19]

Symanski et al.

[11] 4,044,271
[45] Aug. 23, 1977

[54] MONOLITHIC NTDS DRIVER AND RECEIVER

[75] Inventors: Jerome J. Symanski, San Diego; Russell L. Keefer, Spring Valley, both of Calif.

[73] Assignee: The United States of America as represented by the Secretary of the Navy, Washington, D.C.

[21] Appl. No.: 504,393

[22] Filed: Sept. 9, 1974

[51] Int. Cl.$^2$ .......................... H03K 1/14; H03K 5/00
[52] U.S. Cl. .................................. 307/262; 307/264; 307/268; 307/DIG. 1
[58] Field of Search ............... 307/214, 262, 264, 270, 307/DIG. 1, 215, 268, 313

[56] References Cited

U.S. PATENT DOCUMENTS

| | | | |
|---|---|---|---|
| 3,433,978 | 3/1969 | Bongenaar et al. | 307/214 |
| 3,728,559 | 4/1973 | Spann et al. | 307/264 |
| 3,766,406 | 10/1973 | Bryant et al. | 307/214 X |
| 3,816,765 | 6/1974 | Goyer | 307/260 A |
| 3,860,830 | 1/1975 | Sugiura et al. | 307/214 X |

Primary Examiner—John Zazworsky
Attorney, Agent, or Firm—R. S. Sciascia; G. J. Rubens; H. Fendelman

[57] ABSTRACT

A voltage level shifting driver and receiver for interfacing systems using positive logic levels and systems using negative logic levels. The driver operates to convert positive voltage logic levels to negative voltage logic levels and the receiver operates to convert negative voltage logic levels back to positive voltage logic levels.

15 Claims, 3 Drawing Figures

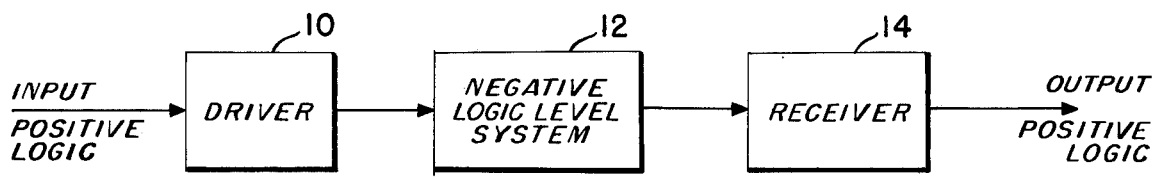
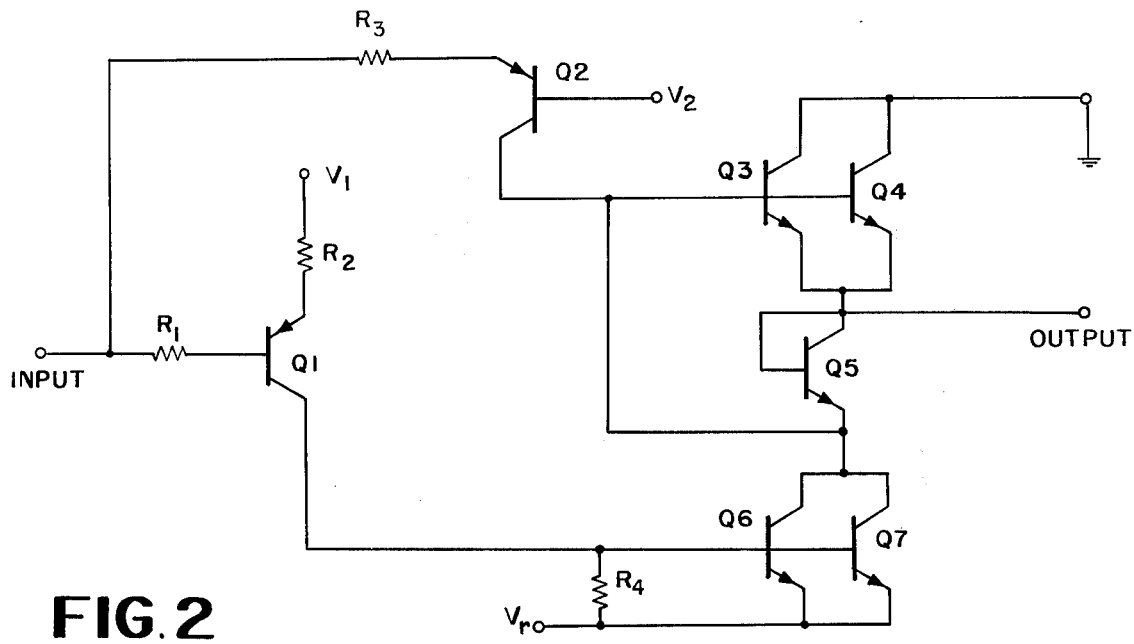
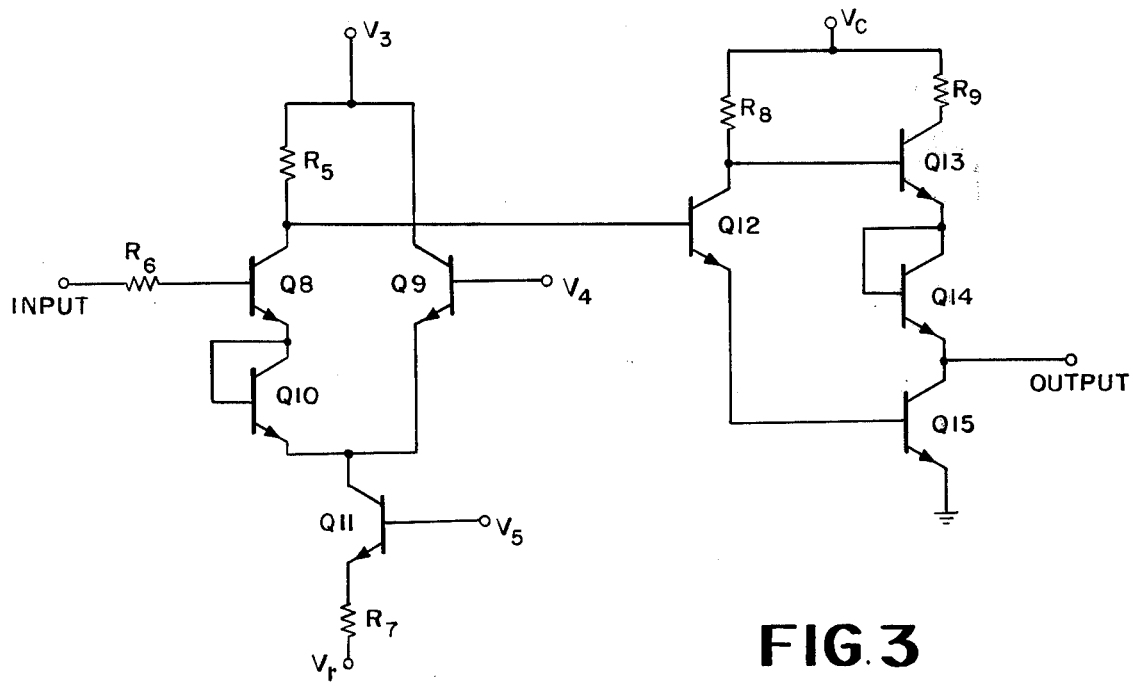

MONOLITHIC NTDS DRIVER AND RECEIVER

BACKGROUND OF THE INVENTION

Presently there exists a multitude of equipment for communicating with general purpose computers. Each piece of equipment has established specifications for the timing, voltage swings and drive capabilities for communicating with the computers. A problem has arisen since the voltage swings for many interfaces are negative, but a widely used logic family uses transistor-transistor-logic (TTL) which uses positive voltages. Hence, positive logic levels must be shifted to negative logic levels whenever new equipment is designed. Previously, this level shifting was accomplished by using discrete devices such as resistors, capacitors, transistors and diodes assembled by hand on a printed circuit board. This method is costly, requires much manual labor, is complex and requires a relatively large volume.

SUMMARY OF THE INVENTION

The present invention performs the voltage level shifting required to interface electronic systems using negative voltage logic levels and systems using positive logic voltage levels. A bipolar monolithic integrated driver circuit converts positive voltage logic levels to negative voltage logic levels. A monolithic integrated receiver circuit converts the negative voltage logic levels back to the positive voltage logic levels. The design of the driver and receiver of the present invention results in a low power dissipation network which lends itself readily to simplicity of integration. The present invention is particularly useful where cross-talk is not a problem due to the short rise time involved.

STATEMENT OF THE OBJECTS OF THE INVENTION

Accordingly, it is the primary object of the present invention to disclose a novel level shifting network.

Other objects, advantages and novel features of the invention will become apparent from the following detailed description of the invention when considered in conjunction with the accompanying drawings.

BRIEF DESCRIPTION OF THE DRAWINGS

FIG. 1 is a block diagram of the level shifting network of the present invention.

FIG. 2 is a circuit schematic diagram of the level shifting driver of the present invention.

FIG. 3 is a circuit schematic diagram of the level shifting receiver of the present invention.

DESCRIPTION OF THE PREFERRED EMBODIMENTS

As illustrated in FIG. 1, the present invention comprises a driver 10 for receiving positive logic level input signals and for converting the positive logic levels to negative logic levels for subsequent use by the negative logic level system 12. The negative logic levels produced by system 12 are subsequently converted by receiver 14 into a positive logic level output.

The details of the level shifting driver 10 are illustrated in FIG. 2. Connected to the input are two signal receiving transistors Q1 and Q2. The base electrode of transistor Q1 is connected to the input terminal through resistor $R_1$ and the emitter electrode of transistor Q1 is connected to positive voltage supply $V_1$ through resistor $R_2$. The base electrode of transistor Q2 is connected to positive voltage supply $V_2$ and the emitter electrode is connected to the input terminal through resistor $R_3$. $V_1$ is a higher voltage than $V_2$. The output stage comprises a first pair of dual transistors Q3 and Q4 with their bases connected to the collector of input transistor Q2 and their collectors connected to ground. The emitters of transistors Q3 and Q4 are connected through transistor Q5 which functions as a diode due to the short circuit base-collector connection to the collectors of a second dual transistor pair Q6 and Q7. The bases of output transistors Q6 and Q7 are connected to the collector of input transistor Q1 and the emitters of output transistors Q6 and Q7 are connected to negative voltage reference supply $V_r$. Resistor $R_4$ is connected between the base electrodes of transistors Q6 and Q7 and the emitter electrodes. The output has been illustrated and described as including dual transistors to enhance the output current capability. It is to be understood, however, that single transistors could also be used.

The operation of the driver circuit is as follows. When the input is at a low positive logic level, transistor Q2 is non-conducting and transistor Q1 is conducting permitting current to flow into the bases of transistors Q6 and Q7 which are thus biased into conduction. The output which is taken at the collector of transistor Q5 is thus pulled down towards the voltage level of negative voltage supply $V_r$. When the positive logic input is high, transistor Q1 is shut off and transistor Q2 is biased into conduction, allowing current to flow into the bases of transistors Q3 and Q4 which are thereby biased into conduction thus raising the output towards ground potential. When the input is at a high positive logic level, therefor, the output is at a high negative logic level, i.e. near ground, and when the input is at a low positive logic level the output is at a low negative logic level, i.e. near $V_r$. Stated another way, when the input receives a positive logic high representing, e.g., a binary 1, the output is translated by the driver 10 into a negative logic high likewise representing a binary 1 but in a negative logic. Similarly when the input receives a positive logic low representing, e.g., a binary 0, the output is translated by the driver 10 into a negative logic low likewise representing a binary 0 but in a negative logic. Transistor Q5, which is connected as a diode, insures that transistors Q3 and Q4 are off when Q6 and Q7 are conducting.

Non-inverting receiver 14 is illustrated in detail in FIG. 3. Transistor Q8 has its collector connected through resistor $R_5$ to positive voltage supply $V_3$ and its base connected to the input terminal through resistor $R_6$. The collector of transistor Q9 is connected to positive voltage supply $V_3$ and the base is connected to negative voltage supply $V_4$. Transistor Q11 is connected at its collector through the base-emitter diode of transistor Q10 to the emitter of transistor Q8 and directly to the emitter of transistor Q9 along with resistor $R_7$ and negative voltage supply $V_r$ comprise a constant current source for the differential amplifier formed by the transistors Q8 and Q9. The base of transistor Q11 is connected to negative voltage supply $V_5$ which has a greater negative voltage level than $V_4$ and a less negative voltage level than $V_r$. Output control transistor Q12 is connected to the differential amplifier at the junction of resistor R5 and transistor Q8. The collector of Q12 is connected through resistor R8 to positive voltage supply $V_c$ and to the base electrode of transistor Q13. The collector of Q13 is connected to positive voltage supply $V_c$ through resistor $R_9$ and the emitter of Q13 is connected through the base-emitter diode of transistor Q14 to the collector of transistor Q15. The base of Q15 is connected to the emitter of Q12 and the emitter of Q15 is connected to ground.

The operation of the receiver is as follows. When the input is above the threshold established by the negative voltage supply $V_4$, i.e. at a high negative voltage logic level, Q8 conducts shutting off transistor Q12 so that no base current flows into Q15. The collector of Q12 rises towards $V_c$ turning of Q13 which pulls the output high. When the input is below the threshold established by $V_4$, Q8 is non-conducting. The collector of Q8 rises towards $V_3$, turning on Q12 which provides base circuit to transistor Q15. The output is thus pulled down towards ground potential. When the input is at a high negative logic level, therefor, the output is at a high positive voltage logic level and when the input is at a low negative logic level, the output is at a low positive voltage logic level. Stated another way, when the input receives a negative logic high representing, e.g., a binary 1 in negative logic, the output is translated by the receiver 14 into a positive logic high likewise representing a binary 1. Similarly, when the input receives a negative logic low representing, e.g., a binary 0 in negative logic, the output is translated by receiver 14 into a positive logic low likewise representing a binary 0. Thus the receiver 14 is seen to be non-inverting in that a high in negative logic at the input is translated to a high in positive logic at the output and a low in negative logic at the input is translated into a low in positive logic at the output. The receiver 14 thereby effectuates a change from one logic level to another but does not invert the binary data represented by the logic levels. Transistor Q10 and resistor $R_6$ are used for input protection. Q14 prevents current surges during switching.

Obviously many modifications and variations of the present invention are possible in the light of the above teachings. It is therefore to be understood that within the scope of the appended claims the invention may be practiced otherwise than is specifically described.

What is claimed is:

1. A level shifting network comprising:
   a negative voltage logic level system having an input and an output;
   a driver network including an input and an output for converting positive voltage logic levels to the negative voltage logic levels of said negative voltage logic level system comprising first and second transistor means connected to said driver input, third and fourth transistor means connected to said first and second transistor means respectively for outputting at said driver output negative voltage logic levels to said negative voltage logic level system, whereby in response to a low positive voltage logic level signal at said driver input, said driver output is at a low negative voltage logic level and in response to a high positive voltage logic level signal at said driver input, said driver output is at a high negative voltage logic level;
   a receiver network including an output for converting the negative voltage logic levels of said negative voltage logic level system to positive voltage logic levels comprising a differential amplifier having a first input connected to the output of said negative voltage logic level system, a second input, and an output, said receiver network further including a fifth transistor means connected to the output of said differential amplifier, sixth and seventh transistor means connected to said fifth transistor means for outputting positive voltage logic levels at said receiver output, whereby in response to a low negative voltage logic level and in response to a high negative voltage logic level signal at said first input, said receiver output is at a high positive voltage logic level.

2. The network of claim 1 wherein said first transistor means has a base, an emitter and a collector, said first transistor means base being connected to said driver input, said first transistor means collector being connected to said third transistor means;
   said second transistor means having a base, an emitter and a collector, said second transistor means emitter being connected to said driver input, said second transistor means collector being connected to said fourth transistor means;
   said first transistor means being conducting in response to low positive voltage logic level signals at said driver input and being non-conducting in response to high positive voltage logic level signals at said driver input;
   said second transistor means being conducting in response to high positive voltage logic level signals at said driver input and being non-conducting in response to low positive voltage logic level signals at said driver input.

3. The network of claim 2 wherein:
   said third transistor means has a base, an emitter and a collector;
   said first transistor means collector being connected to said third transistor means base;
   said fourth transistor means has a base, an emitter and a collector;
   said second transistor means collector being connected to said fourth transistor means base.

4. The network of claim 3 wherein:
   said fifth transistor means includes a base, an emitter and a collector;
   said fifth transistor means base being connected to said differential amplifier output;
   said sixth transistor means includes a base, an emitter, and a collector, said sixth transistor means base being connected to said fifth transistor emitter;
   said seventh transistor means includes a base, an emitter, and a collector, said seventh transistor means base being connected to said fifth transistor means collector.

5. The network of claim 4 wherein said receiver network includes a constant current source connected to said differential amplifier.

6. A level shifting network for shifting positive voltage logic levels to negative voltage logic levels comprising:
   an input and an output;
   first and second transistor means connected to said input for receiving positive voltage logic level signals and for switching in response to a voltage change in said positive voltage logic level signals;
   said first and second transistor means having first and second transistor outputs, respectively;
   third and fourth transistor means operably connected to said first and second transistor means outputs, respectively and to said output for switching in response to switching of said first and second transistor means;
   said third transistor means being connected to a negative voltage supply;

said fourth transistor means being connected to ground;

whereby in response to a positive voltage logic low at said input, said output produces a negative voltage logic low and in response to a positive voltage logic high at said input, said output produces a negative voltage logic high.

7. A level shifting network for shifting positive voltage logic levels to negative voltage logic levels comprising:

an input and an output;

first and second transistor means connected to said input for receiving positive voltage logic level signals and for switching in response to a voltage change in said positive voltage logic level signals;

said first and second transistor means having first and second transistor outputs, respectively;

third and fourth transistor means operably connected to said first and second transistor means outputs, respectively and to said output for switching in response to switching of said first and second transistor means;

said third transistor means being connected to a negative voltage supply;

said fourth transistor means being connected to ground;

whereby in response to a positive voltage logic low at said input, said output produces a negative voltage logic low and in response to a positive voltage logic high at said input, said output produces a negative voltage logic high;

said first transistor means including a base and a collector, said first transistor means base being connected to said input;

said second transistor means including an emitter and a collector, said second transistor means emitter being connected to said input;

said third transistor means including a base and an emitter, the base of said third transistor means being connected to the collector of said first transistor means;

said fourth transistor means including a base and a collector, said fourth transistor means base being connected to said second transistor means collector;

the emitter of said third transistor means being connected to said negative voltage supply;

the collector of said fourth transistor means being connected to ground.

8. The network of claim 7 wherein:

said third transistor means includes a collector;

said fourth transistor means includes an emitter; and further including a diode connected between said third transistor means collector and said fourth transistor means emitter.

9. A level shifting network for shifting negative voltage logic levels to positive voltage logic levels comprising:

a differential amplifier having first and second bias inputs, a first solely DC coupled input and an output;

a first transistor having a base, an emitter and a collector, said first transistor base being connected to said differential amplifier output whereby in response to a negative voltage logic high at said first solely DC coupled differential amplifier input, said first transistor is non-conducting and in response to a negative voltage logic low at said first solely DC coupled input, said first transistor is conducting;

a level shifting network output;

a second transistor including a base, an emitter and a collector, said second transistor base being connected to said first transistor emitter for outputting to said level shifting network output a positive voltage logic low upon conduction of said first transistor;

a third transistor including a base, an emitter and a collector, said third transistor base being connected to said first transistor collector for outputting to said level shifting network output a positive voltage logic high upon non-conduction of said first transistor.

10. The network of claim 9 wherein said second transistor collector is connected to said third transistor emitter through a diode.

11. The network of claim 10 including a constant current source connected to said differential amplifier.

12. The network of claim 10 wherein said second transistor emitter is connected to ground and said third transistor collector is connected to a positive voltage supply.

13. The network of claim 9 wherein:

a negative voltage supply is connected to said second solely DC coupled input.

14. The network of claim 9 further including:

second and third transistor comprising said differential amplifier;

said second transistor having a collector comprising said differential amplifier output such that said first transistor base is connected to said second transistor collector;

said third transistor having a base connected to said second solely DC coupled input; and a negative voltage supply connected to said second solely DC coupled input.

15. The network of claim 14 further including:

a constant current source connected to said differential amplifier comprising a voltage supply and a transistor connected to said voltage supply.

* * * * *